(12) United States Patent
Pyzik et al.

(10) Patent No.: US 8,399,107 B2
(45) Date of Patent: Mar. 19, 2013

(54) COMPOSITION FOR MAKING METAL MATRIX COMPOSITES

(75) Inventors: Aleksander J. Pyzik, Midland, MI (US); Ted A. Morgan, Midland, MI (US); Terry I. Hu, Midland, MI (US); Daniel R. Lister, Delaware, OH (US); Robert A. Newman, Midland, MI (US); Richard Allen Lundgard, Midland, MI (US); Qin Deng, Shanghai (CN)

(73) Assignee: Dow Global Technologies LLC, Midland, MI (US)

( * ) Notice: Subject to any disclaimer, the term of this patent is extended or adjusted under 35 U.S.C. 154(b) by 1620 days.

(21) Appl. No.: 10/551,727

(22) PCT Filed: Apr. 8, 2004

(86) PCT No.: PCT/US2004/010837
§ 371 (c)(1),
(2), (4) Date: Oct. 30, 2008

(87) PCT Pub. No.: WO2004/092430
PCT Pub. Date: Oct. 28, 2004

(65) Prior Publication Data
US 2011/0135948 A1 Jun. 9, 2011

Related U.S. Application Data

(60) Provisional application No. 60/461,642, filed on Apr. 9, 2003.

(51) Int. Cl.
*C22C 32/00* (2006.01)
(52) U.S. Cl. ............... 428/539.5; 428/457; 428/545; 428/688
(58) Field of Classification Search ............... 428/539.5, 428/457, 545, 688
See application file for complete search history.

(56) References Cited

U.S. PATENT DOCUMENTS 3,753,694 A 8/1973 Badia et al.
(Continued)

FOREIGN PATENT DOCUMENTS

EP 0 323 067 7/1989
EP 0 370 546 5/1990
(Continued)

OTHER PUBLICATIONS

"Interface Tailoring in Carbon Fiber-Reinforced Metal Matrix Composites", Bouix, J.; Journal de Physique IV (1997); Publisher: Editions de Physique, Villeurbanne, France.

(Continued)

*Primary Examiner* — Jennifer McNeil
*Assistant Examiner* — Lauren Colgan

(57) ABSTRACT

In one embodiment, a composition (10) to be mixed with a molten metal to make a metal matrix composite, the composition characterized by: a ceramic reinforcing filler (12), the ceramic reinforcing filler not being wettable by molten aluminum and/or not being chemically stable in molten aluminum, the ceramic reinforcing filler being coated with a ceramic material, the ceramic material being wettable by and chemically stable in molten aluminum. In a related embodiment, a composition (20) to make a porous preform to be infiltrated by molten metal to make a metal matrix composite, the composition characterized by: a ceramic reinforcing filler (23), the ceramic reinforcing filler not being wettable by molten aluminum, the ceramic reinforcing filler being coated with a ceramic material (22) and optionally with a metal (21) such as nickel, the ceramic material being wettable by molten aluminum. The ceramic material can be coated on the ceramic reinforcing filler by a vacuum deposition technique such as vacuum sputtering.

11 Claims, 1 Drawing Sheet

U.S. PATENT DOCUMENTS

| | | | |
|---|---|---|---|
| 4,499,156 A | 2/1985 | Smith et al. | |
| 4,559,246 A | 12/1985 | Jones | |
| 4,600,481 A | 7/1986 | Sane et al. | |
| 5,399,378 A | 3/1995 | Uemura et al. | |
| 2011/0135948 A1 | 6/2011 | Pyzik et al. | |

FOREIGN PATENT DOCUMENTS

| | | | |
|---|---|---|---|
| EP | 1 245 314 A2 | | 10/2002 |
| JP | 58-144441 | * | 8/1983 |
| JP | 58144441 A | | 8/1983 |
| JP | 01062401 | | 3/1989 |

OTHER PUBLICATIONS

"Boron Carbide Formation from BC13-CH4-H2 Mixtures on Carbon Substrates and in a Carbon-Fiber Reinforced Al Composite", Vincent, H.; Carbon (1996), 34(9), p. 1041-1055; Publisher: Elsevier, Villeurbanne, France.

"Mechanical Properties of T300/Al Composites. Embrittlement Effects Due to a B4C Coating", R'Mill, M; Journal of Materials Science (1996), 31(17), p. 4533-4539; Publisher: Chapman & Hall, Villeurbanne, France.

Rohatgi, Defense Science Journal, vol. 43, No. 4, Oct. 1993, pp. 323-349.

Materials Chemistry and Physics 67 (2001) 249-255, Low-temperature processing of B4C-Al composites via infiltration technique, B.-S. Lee, S. Kang.

Rajan, T.P.D. et al., J. of Materials Science, 33, 3491-3503 (1998) "Review Reinforcement coatings and interfaces in aluminium metal matrix composites".

Yu, Zhi-giang et al., School of Materials Science and Engineering, Harbin Institute of Technology, "Present progres on studies of reinforcement carbon, silicon carbide and alumina surface coatings in aluminum metal matrix composites".

Eroglu, O.D., et al., Chem. Engr. Communications, 190(3), 360-372 (2003), "Synthesis and characterization of boron carbide films by plasma-enhanced chemical vapor deposition".

C. Vincent et al., Composites: Part A, vol. 27A, p. 365-377 (1996), "ESCA characerization of boron and silicon carbide mixed layers deposited on HR and HM carbon fibres by RCVD: properties of the as-coated fibres".

* cited by examiner

US 8,399,107 B2

COMPOSITION FOR MAKING METAL MATRIX COMPOSITES

CROSS-REFERENCE TO RELATED APPLICATIONS

This is a §371 application from PCT International Patent Application Number PCT International Patent Application Number PCT/US2004/010837 filed 8 Apr. 2004, and claims benefit from U.S. Provisional Patent Application No. 60/461,642, filed 9 Apr. 2003.

TECHNICAL FIELD

The instant invention is in the field of materials wherein a reinforcing filler is interdispersed with a metal phase. In other words, the instant invention is in the field of Metal Matrix Composites (MMC).

BACKGROUND

Metal Matrix Composites (MMC) are a class of materials wherein a reinforcing filler is interdispersed with a metal phase. See Rohatgi, Defense Science Journal, Vol. 43, No. 4, October 1993, pp 323-349. In the preparation of one type of MMC material, particulate ceramic reinforcing filler is mixed with a molten metal and then the mixture is cooled to form an MMC article. In the preparation of another type of MMC material, a porous ceramic preform comprising a ceramic reinforcing filler is infiltrated with a molten metal and then the metal-filled preform is cooled to form the MMC article. MMC's tend to be stiffer and stronger than metals but more ductile than ceramics.

In general, in order to achieve high performance in an MMC made by mixing a ceramic reinforcing filler with a molten metal and then cooling the mixture to form the MMC article, there should be: (a) good wetability of the ceramic reinforcing filler by the molten metal; (b) good chemical stability of the ceramic reinforcing filler in the molten metal; (c) good dispersion of the ceramic reinforcing filler in the molten metal; and (d) good adhesion between the ceramic reinforcing filler and the metal after the MMC is formed.

In general, in order to achieve high performance in an MMC made by wetting a preform with a molten metal and then cooling the metal-filled preform to form an MMC article, there should be: (a) good wetability of the ceramic reinforcing filler of the preform by the molten metal; and (b) good adhesion between the ceramic reinforcing filler and the metal after MMC is formed.

Ceramic reinforcing fillers that perform well in MMC's (for example, titanium diboride or titanium carbide mixed with molten aluminum or porous boron carbide preforms infiltrated with molten aluminum) are relatively expensive resulting in significantly increased cost of an MMC article. Ceramic reinforcing fillers that are relatively low in cost tend to perform poorly in MMC's. For example, alumina ($Al_2O_3$) and silica ($SiO_2$) are relatively low cost reinforcing filler materials but neither silica nor alumina are wetted by molten aluminum. Alumina reinforcing filler particles tend to agglomerate in molten aluminum instead of being well dispersed while silica reacts in molten aluminum to form Si rich Al and $Al_2O_3$. It would be a substantial advance in the MMC art if the relatively low cost ceramic reinforcing fillers of the type that are not wetted by molten aluminum could be used to produce lower cost, high performance MMC's

DISCLOSURE OF INVENTION

The instant invention is a composition to be mixed with a molten metal to make a metal matrix composite, the composition characterized by: a ceramic reinforcing filler, the ceramic reinforcing filler not being wettable by molten aluminum and/or not being chemically stable in molten aluminum, the ceramic reinforcing filler being coated with a ceramic material, the ceramic material being wettable by and chemically stable in molten aluminum.

In another embodiment, the instant invention is a composition to make a porous preform to be infiltrated by a molten metal to make a metal matrix composite, the composition characterized by: a ceramic reinforcing filler, the ceramic reinforcing filler not being wettable by molten aluminum, the ceramic reinforcing filler being coated with a ceramic material, the ceramic material being wettable by molten aluminum.

In another embodiment, the instant invention is a process for coating a ceramic reinforcing filler with a ceramic material, the process characterized by the steps of: (a) positioning the ceramic reinforcing filler in a vacuum chamber; and (b) vaporizing a ceramic material in the vacuum chamber so that the ceramic material deposits on the ceramic reinforcing filler.

In yet another embodiment, the instant invention is a metal matrix composite article made by a process characterized by the steps of: (a) mixing a molten aluminum or molten aluminum alloy with the composition of the first paragraph of this section to form a mixture thereof; and (b) cooling the mixture to form the metal matrix composite article.

In a yet further embodiment, the instant invention is a metal matrix composite article made by a process characterized by the steps of: (a) forming a porous preform from the composition of the second paragraph of this section; (b) contacting the porous preform with molten aluminum or molten aluminum alloy so that the molten aluminum or molten aluminum alloy infiltrates into the porous preform to produce an infiltrated preform; and (c) cooling the infiltrated preform to form the metal matrix composite article.

MODES FOR CARRYING OUT THE INVENTION

Figure 1:
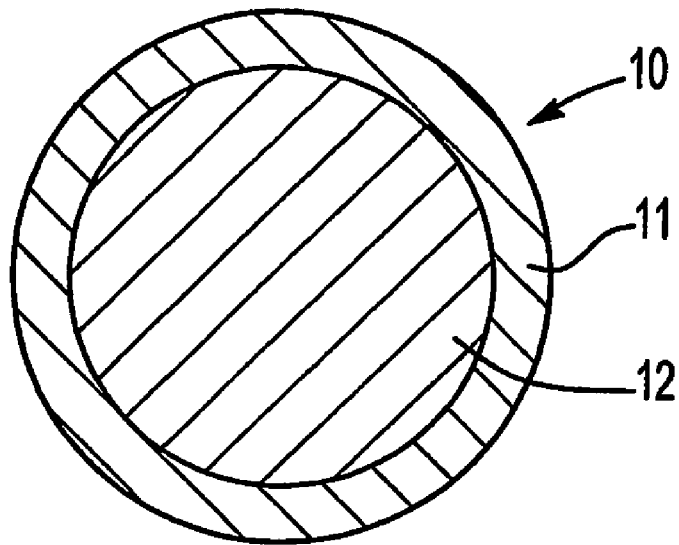
FIG. 1 is a cross-sectional view of a composition of the instant invention consisting of an alumina particle coated with a layer of boron carbide.

Referring now to FIG. 1, therein is shown a cross-sectional view of a composition 10 of the instant invention consisting of an alumina reinforcing filler particle 12 coated with a layer of boron carbide 12. The layer of boron carbide 12 is formed on the alumina particle 12 by plasma sputtering boron carbide onto mechanically stirred alumina particles in a conventional plasma-sputtering chamber. Uncoated alumina particles are not "wetted" by molten aluminum. The term wetted as used herein means a contact angle greater than ninety degrees. The boron carbide coating is wetted by molten aluminum, e.g., aluminum at a temperature above 1000 degrees Centigrade.

The embodiment shown in FIG. 1 can be formed into a porous ceramic preform by any suitable technique (such as slip casting), contacting the porous preform with molten aluminum so that the molten aluminum (or molten aluminum alloy) infiltrates into the porous ceramic preform, followed by cooling to form an MMC article. The molten aluminum will wick into the porous preform because molten aluminum wets the boron carbide layer 11 on the alumina particle 12.

The embodiment shown in FIG. 1 is not specifically suitable for mixing with molten aluminum (or a molten aluminum alloy) for casting MMC articles because the boron carbide layer 11 tends to react with the molten aluminum before the molten aluminum can be cast, i.e., the boron carbide layer is not chemically stable in the molten aluminum and the resulting de-coated alumina particles then tend to agglomerate in the molten aluminum. Thus, when alumina reinforcing filler is used in the instant invention for mixing with molten aluminum for casting MMC articles, a chemically stable ceramic material coating is used such as titanium diboride or more preferably titanium diboride additionally coated with tungsten or nickel. Similarly, when a graphite reinforcing filler is used, the ceramic material coating can be silicon carbide or titanium diboride that is more preferably additionally coated with tungsten, cobalt or nickel.

Figure 2:
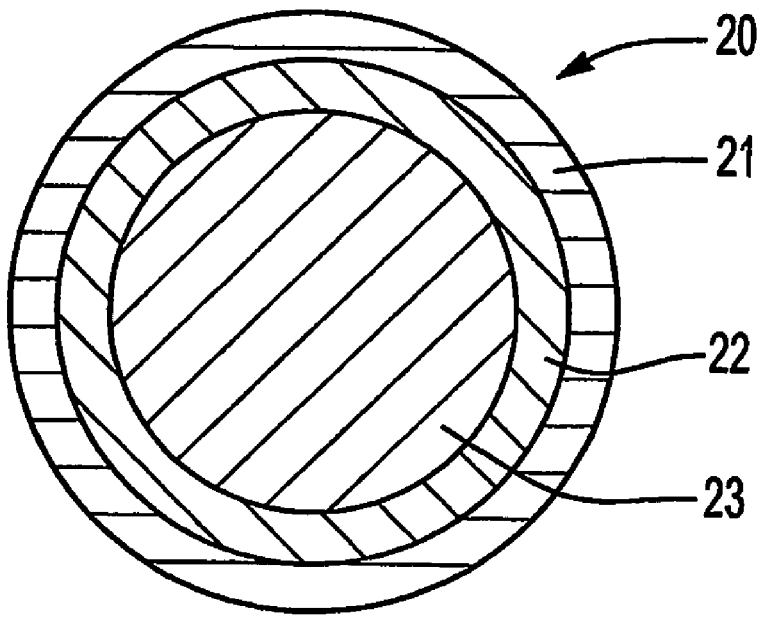
FIG. 2 is a cross-sectional view of another composition of the instant invention consisting of a silica particle coated with a layer of titanium diboride that is in turn coated with a layer of nickel.

Referring now to FIG. 2, therein is shown a cross-sectional view of another composition 20 of the instant invention that is highly preferred consisting of a silica reinforcing filler particle 23 coated with a layer of titanium diboride 22 that is in turn coated with a layer of nickel 21. The layer of titanium diboride 22 is wetted by molten aluminum but the layer of nickel 21 enhances the wettability of the composition 21 with molten aluminum. The layer of titanium diboride 22 is formed on the silica particle 23 by plasma sputtering titanium diboride onto mechanically stirred silica particles in a conventional plasma-sputtering chamber followed by an annealing process to convert the substantially amorphous titanium diboride into a more dense and crystalline annealed titanium diboride. A determination of the structure of the ceramic material coating to determine whether it is amorphous or annealed can be made by X-ray diffraction analysis.

The annealing process can be conducted by introducing argon into the plasma-sputtering chamber after the coating step followed by heating of the composition to a temperature sufficient to anneal the ceramic material so that the ceramic material is substantially non-reactive with molten aluminum. A substantially amorphous titanium diboride coating can be annealed in about an hour at 1000 degrees Celsius. A substantially amorphous titanium nitride coating can be annealed in about an hour or two at 700 degrees Celsius and in about one half hour at 1000 degrees Celsius. The layer of nickel 21 is then formed by conventional electroless nickel coating. The layer of nickel 21 enhances the wetting of the composition by molten aluminum or molten aluminum alloy. Alternatively, titanium diboride (or titanium nitride or other ceramic materials) can be coated on the filler material as an already annealed coating if the filler material is heated (for example to a temperature of 500-700 degrees Celsius) during the plasma sputtering process.

The embodiment shown in FIG. 2 is specifically suitable for mixing with molten aluminum for casting MMC articles because the annealed titanium diboride layer 22 does not react with the molten aluminum (even in the absence of the nickel layer 21) before the molten aluminum can be cast, i.e., the annealed titanium diboride layer 22 is chemically stable in molten aluminum. On the other hand, if the titanium diboride (or titanium nitride) coated on the ceramic reinforcing filler is not annealed, then surprisingly the titanium diboride (or titanium nitride or almost any other otherwise non-reactive ceramic material) is reactive with molten aluminum or molten aluminum alloys. When the titanium diboride or titanium nitride is not annealed and reacts with the molten aluminum or molten aluminum alloy, then the titanium tends to beneficially alloy with the aluminum.

The discussion above related to FIGS. 1 and 2 is directed to specific embodiments. However, it should be understood that in its broad scope, the instant invention is a composition to be mixed with a molten metal to make a metal matrix composite or to make a porous preform to be infiltrated by a molten metal to make a metal matrix composite, the composition comprising: ceramic reinforcing filler, the ceramic reinforcing filler not being wettable by molten aluminum and/or not being chemically stable in molten aluminum, the ceramic reinforcing filler being coated with a ceramic material, the ceramic material being wettable by and/or chemically stable in molten aluminum, molten magnesium, molten copper, molten titanium or alloys thereof.

The ceramic reinforcing filler is preferably selected from the group consisting of oxides, carbides, borides and nitrides such as sand, clay, mullite, alumina, titanium dioxide, magnesium oxide, silica, carbon, iron oxide, yttrium oxide, zirconium oxide, molybdenum oxide, tantalum oxide, niobium carbide, tungsten carbide and silicon carbide. The ceramic reinforcing filler is most preferably selected from the group consisting of alumina, silicon carbide, silica and acicular mullite. The ceramic material coating is preferably selected from the group consisting of titanium diboride, aluminum nitride, titanium nitride, titanium carbide, silicon carbide and boron carbide. The optional additional metal coating is preferably selected from group consisting of W, Mo, Ti, Ni, Cu, Hf, Fe, Co, Al and Si. The ceramic material can be coated onto the ceramic reinforcing filler by any suitable method but preferably by conventional plasma sputtering. Most preferably, the metal optionally coated on the ceramic material coating is nickel or tungsten. The metal layer can be coated onto the ceramic material layer by any suitable method such as electroless deposition, electroplating and plasma sputtering.

Acicular mullite coated with titanium diboride is a preferred embodiment of the instant invention. Acicular mullite coated with titanium diboride and then coated with nickel is also a preferred embodiment of the instant invention. Carbon (amorphous or graphitic carbon) coated with silicon carbide is a preferred embodiment of the instant invention. Carbon (amorphous or graphitic carbon) coated with silicon carbide and then coated with tungsten, copper or nickel is also a preferred embodiment of the instant invention. The ceramic reinforcing filler can be of any shape, e.g., in the shape of platelets, whiskers or fibers as well as particles having an aspect ratio closer to or equal to one.

The thickness of the coating of ceramic material on the ceramic reinforcing filler is preferably less than one micrometer, more preferably less than one half micrometer, and even more preferably less than one tenth of one micrometer. A thinner coating is preferred to reduce the cost of the composition. However, a coating of ceramic material that is too thin will leave a sufficient portion of the filler exposed to the molten metal resulting in chemical instability of the filler and/or agglomeration of the filler. Most preferably, the coating is both thin and completely covers the filler. The particle size of the reinforcing filler is typically in the range of from ten to one hundred micrometers.

Metal matrix composite articles of the instant invention can be made from the compositions of the instant invention by: (a) mixing a molten metal, such as molten aluminum or molten aluminum alloy, with such a composition to form a metal-composition mixture; and (b) then cooling the metal-composition mixture to form the metal matrix composite article. In most cases, the metal-composition mixture will be introduced into a mold before step (b).

Metal matrix composite articles of the instant invention can also be made from the compositions of the instant invention by (a) forming a porous perform, the porous perform comprising such a composition; (b) infiltrating the porous perform with molten metal, such as molten aluminum or molten aluminum alloy, to form an infiltrated perform; and (c) cooling the infiltrated perform to form the metal matrix composite article. For example, the perform can comprise interconnected mullite grains having a needle morphology (acicular mullite) as the ceramic reinforcing filler.

The metal matrix composite articles of the instant invention can be used in an almost unlimited number of applications. For example, the metal matrix composite article of the instant invention can be a thermal management article selected from the group consisting of heat spreaders, heat sinks, combination heat spreaders/heat sinks and thermal base plates. Examples of metal matrix composite articles of the instant invention for motor vehicle application include parts selected from the group consisting of disk brake rotors, brake pads, brake pistons, brake calipers, brake pad back plates, brake drums, steering knuckles, engine cylinder liners, cylinder head inserts, pistons, piston rings, main bearing inserts, cam lobes, cam followers, valves, valve guides and valve seats.

EXAMPLE 1

One hundred grams of alumina powder (A10 grade from Alcoa) is placed in a stirred cup in a vacuum sputtering chamber. The sputtering target (boron carbide) is fifteen centimeters in diameter and mounted in a water cooled holder. The target is placed four centimeters from the stirred cup and operated at 180 watts. The alumina powder is coated with the boron carbide in the sputtering chamber and then weighed. The coated alumina powder weighs one hundred and two grams. X-ray photoelectron spectroscopy analysis indicates a surface coverage by the boron carbide on the alumina of about eighty percent. The boron carbide coated alumina is pressed into a disk shaped preform and contacted with aluminum in a vacuum oven at 1200 degrees Celsius. The aluminum melts and wicks into the preform which is then removed from the oven and cooled to room temperature to form a disk shaped MMC article.

EXAMPLE 2

One hundred grams of alumina powder (A10 grade from Alcoa) is placed in a stirred cup in a vacuum sputtering chamber. The sputtering target (titanium diboride) is mounted in a water cooled holder. The alumina powder is coated with the titanium diboride in the sputtering chamber and then weighed. The coated alumina powder weighs one hundred and three grams. X-ray photoelectron spectroscopy analysis indicates a surface coverage by the titanium diboride on the alumina of about eighty five percent. X-ray diffraction analysis indicates that the titanium diboride coating is substantially amorphous in crystalline structure. The titanium diboride coated alumina is pressed into a disk shaped preform and contacted with aluminum in a vacuum oven at 1200 degrees Celsius. The aluminum melts and slowly wicks into the preform which is then removed from the oven and cooled to room temperature to form a disk shaped MMC article.

EXAMPLE 3

One hundred grams of alumina powder (A10 grade from Alcoa) is placed in a stirred cup in a vacuum sputtering chamber. The sputtering target (titanium metal) is mounted in-a water cooled holder. The vacuum chamber contains a reduced pressure of nitrogen gas. The alumina powder is coated with the titanium nitride in the sputtering chamber and then weighed. The coated alumina powder weighs one hundred and two grams. X-ray photoelectron spectroscopy analysis indicates a surface coverage by the titanium nitride on the alumina of about eighty five percent. X-ray diffraction analysis indicates that the titanium nitride coating is substantially amorphous in crystalline structure. The titanium nitride coated alumina is treated with an electroless nickel plating solution to deposited a one micron thick layer of nickel on the titanium nitride coating. The nickel coated, titanium nitride coated alumina is pressed into a disk shaped preform and contacted with aluminum in a vacuum oven at 750 degrees Celsius. The aluminum melts and rapidly wicks into the preform which is then removed from the oven and cooled to room temperature to form a disk shaped MMC article.

EXAMPLE 4

One hundred grams of alumina powder (A10 grade from Alcoa) is placed in a stirred cup in a vacuum sputtering chamber. The sputtering target (titanium diboride) is mounted in a water cooled holder. The alumina powder is coated with the titanium diboride in the sputtering chamber and then weighed. The coated alumina powder weighs one hundred and three grams. X-ray photoelectron spectroscopy analysis indicates a surface coverage by the titanium diboride on the alumina of about eighty five percent. X-ray diffraction analysis indicates that the titanium diboride coating is substantially amorphous in crystalline structure. The titanium diboride coated alumina powder is then heated to 1000 degrees Celsius in argon for about one hour to anneal the titanium diboride coating. X-ray diffraction analysis indicates that the titanium diboride coating is now substantially crystalline in structure. The annealed titanium diboride coated alumina is mixed with molten aluminum and cast into a mold. The mold is cooled to room temperature to form an MMC article. The MMC article is cross-sectioned and examined by electron microscopy showing alumina powder coated with titanium diboride dispersed in aluminum.

EXAMPLE 5

One hundred grams of silica powder (having an average particle size of about fifty micrometers) is placed in a stirred cup in a vacuum sputtering chamber. The sputtering target (titanium) is mounted in a water cooled holder. The vacuum chamber contains a reduced pressure of nitrogen gas. The silica powder is coated with the titanium nitride in the sputtering chamber and then weighed. The coated silica powder weighs one hundred and four grams. X-ray photoelectron spectroscopy analysis indicates a surface coverage by the titanium nitride on the silica of more than ninety percent. X-ray diffraction analysis indicates that the titanium nitride coating is substantially amorphous in crystalline structure. The titanium nitride coated silica powder is then heated to 1000 degrees Celsius in argon for about one half hour to anneal the titanium nitride coating. X-ray diffraction analysis indicates that the titanium nitride coating is now substantially crystalline in structure. The annealed titanium nitride coated silica is mixed with molten aluminum and cast into a mold. The mold is cooled to room temperature to form an MMC article. The MMC article is cross-sectioned and examined by electron microscopy showing silica powder coated with titanium nitride dispersed in aluminum.

What is claimed is:

1. A composition for making a cast metal matrix composite, the composition comprising molten aluminum or aluminum alloy having mixed therein a ceramic reinforcing filler particulate, the ceramic reinforcing filler particulate not being wettable by molten aluminum and/or not being chemically stable in molten aluminum, the ceramic reinforcing filler particulate being coated with a ceramic material, the ceramic material being wettable by and chemically stable in molten aluminum.

2. The composition of claim 1, further comprising a layer of a metal coated on the ceramic material.

3. The composition of claim 2, wherein the ceramic reinforcing filler particulate is selected from the group consisting of filler comprising sand, mullite, alumina, and silica.

4. The composition of claim 3, wherein the ceramic material coated on the ceramic reinforcing filler particulate is selected from the group consisting of annealed titanium diboride and annealed titanium nitride.

5. The composition of claim 4, wherein the metal is nickel.

6. The composition of claim 1, wherein the ceramic reinforcing filler particulate is selected from the group consisting of filler comprising sand, mullite, alumina, and silica.

7. The composition of claim 6, wherein the ceramic material coated on the ceramic reinforcing filler particulate is selected from the group consisting of annealed titanium diboride and annealed titanium nitride.

8. The composition of claim 1, wherein the thickness of the ceramic material on the ceramic reinforcing filler particulate is less than 1 micrometer.

9. The composition of claim 8, wherein the thickness of the ceramic material on the ceramic reinforcing filler particulate is less than one half micrometer.

10. The composition of claim 8, wherein the ceramic material completely covers the filler.

11. A metal matrix composite article comprising the composition of claim 1 after it has been cast and cooled to solidify the molten aluminum or aluminum alloy.

* * * * *